United States Patent [19]

Golding

[11] 4,433,423
[45] Feb. 21, 1984

[54] HIGH QUALITY DELTA MODULATOR

[75] Inventor: Scott M. Golding, Costa Mesa, Calif.

[73] Assignee: Discovision Associates, Costa Mesa, Calif.

[21] Appl. No.: 344,131

[22] Filed: Jan. 29, 1982

[51] Int. Cl.³ .................... H03K 13/22; H04B 12/04
[52] U.S. Cl. .................................. 375/30; 332/11 D; 340/347 DD
[58] Field of Search ................. 375/33, 28, 30, 25–27, 375/29, 34; 332/11 D; 340/347 AD, 347 DD, 347 M; 358/135; 360/32

[56] References Cited
U.S. PATENT DOCUMENTS
3,173,092  3/1965  Meschi .............................. 375/28 X Primary Examiner—Robert L. Griffin
Assistant Examiner—Albert W. Watkins
Attorney, Agent, or Firm—Ronald J. Clark

[57] ABSTRACT

Method and apparatus for generating a series of delta modulation data signals corresponding to a predetermined analog waveform wherein an error determination comparison is made on a sequentially generated series of potential delta modulation data signals to determine the optimum pattern of delta modulation bits. The method can be performed in iterative fashion for each delta modulation bit generated.

11 Claims, 5 Drawing Figures

HIGH QUALITY DELTA MODULATOR

BACKGROUND OF THE INVENTION

1. Field of the Invention

The present invention relates to the field of analog wave form digital encoding, and more particularly relates to an improved method and apparatus for generating delta modulation data signals.

2. Background Art

Delta modulation is a well known method for encoding analog wave forms into digital form, which may be implemented in a number of ways. Characteristics of delta modulation make it preferable over pulse code modulation in various kinds of applications. For example, certain types of delta modulation systems are particularly suited for operating situations characterized by high error rate.

One such high error rate application involves the encoding and recording of audio frequency information on an optical disc, for example a video optical disc. By encoding one or more messages of audio frequency information in digital form and recording the encoded audio information on the disc, the audio information can be read off the disc and stored for controllable access and playback during, for example, the stop-motion or "freeze frame" playback of a single frame of video from the disc. It is known, however, that at the present state of technology commercial quality video discs have significant levels of short duration signal drop-out. Delta modulation is, therefore, a preferred technique for encoding audio information in such applications. Specifically, adaptive delta modulation ("ADM") provides performance characteristics particularly suited for this purpose.

In connection with the encoding and storage on a recording medium of audio information for later playback, the storage capacity of the medium becomes a significant consideration. For example, while the standard video optical disc is a remarkably high density storage medium for its size, its storage capability is limited and, as a consequence, stop-motion audio encoding formats being developed for the industry utilize delta modulation at a sample rate of between 12 and 28 kilohertz. This range of sample rates reflects a compromise between desired audio message duration and acceptable fidelity. The audio fidelity of decoded adaptive delta modulation audio data, even at 28 kilohertz sampling rate, is noticably degraded from, for example, standard commercial television audio.

It is therefore desired to improve the level of fidelity provided by a delta-modulation system to provide, for example, improved audio playback from a recording medium of ADM encoded audio without increasing the sample rate of the recorded audio information.

Improvements have been suggested. However, the improvements frequently reflect complex theoretical considerations which require expensive implementations for both encoding and decoding. In audio information encoding and recording applications, for example in connection with video optical discs, it is desired to keep decoder implementations as simple as possible in order to keep the costs of optical disc players within the range of consumers. However, since recording media such as optical discs are usually mass produced, the impact of a relatively high cost for encoding audio information for a particular recording may be minimal. It is therefore desired to have an improved delta modulation system which provides optimized delta modulation encoding for relatively inexpensive decoding.

The present invention provides such a system and allows optimization of the encoding of a waveform into ADM data while providing flexibility in the approach to said optimization.

SUMMARY OF THE INVENTION

The present invention resides in a method and apparatus for generating a series of delta modulation data signals at a predetermined clock rate, corresponding to a predetermined waveform. A series of generated digital signals are provided corresponding to sampled amplitude values of the waveform at a rate equal to the predetermined clock rate. Sequential groups of sequential digital signals taken from the series are stored. A series of predetermined patterns of delta modulation data signals for each of the groups of sequential digital signals are provided and converted into corresponding sequences of derived digital signals corresponding to the amplitude values, taken at the sample rate, of a waveform derivable from the sequence by way of delta demodulation. The derived digital signals are compared with the generated digital signals and the sequence of derived digital signals which has the least quantifiable difference, according to a predetermined relationship, with the associated group of generated digital signals is selected. At least one delta modulation signal from each of the patterns of delta modulation signals associated with the selected sequences is stored in sequential order to form the complete series of delta modulation data signals.

The present invention is especially advantageous in applications where it is not essential to generate the delta modulation data signals in real time, but where optimization of the quality of the generated delta modulation signals is important, for example where the same delta modulation signals are to be recorded over and over again on many recording media. According to the present invention, not only can the error between the derived delta modulation waveform be reduced to a minimum as compared with the original waveform, the way in which that error is derived may be varied as desired by the user. Thus, for example, the error which is minimized may be selected to be the mean square difference between the waveforms, or the weighted mean square error. Other approaches to the error evaluation are possible.

It will be appreciated from the foregoing that the present invention represents a significant advance in the field of delta modulation. In particular, the invention provides an improved method and apparatus for generating delta modulation encoded data signals having an error in the derivable waveform from the generated signals which is minimized according to a controllable error detection and minimization scheme. Other aspects and advantages of the present invention will become apparent from the following more detailed description, taken in conjunction with the accompanying drawings.

DETAILED DESCRIPTION OF THE PREFERRED EMBODIMENT

Figure 1:
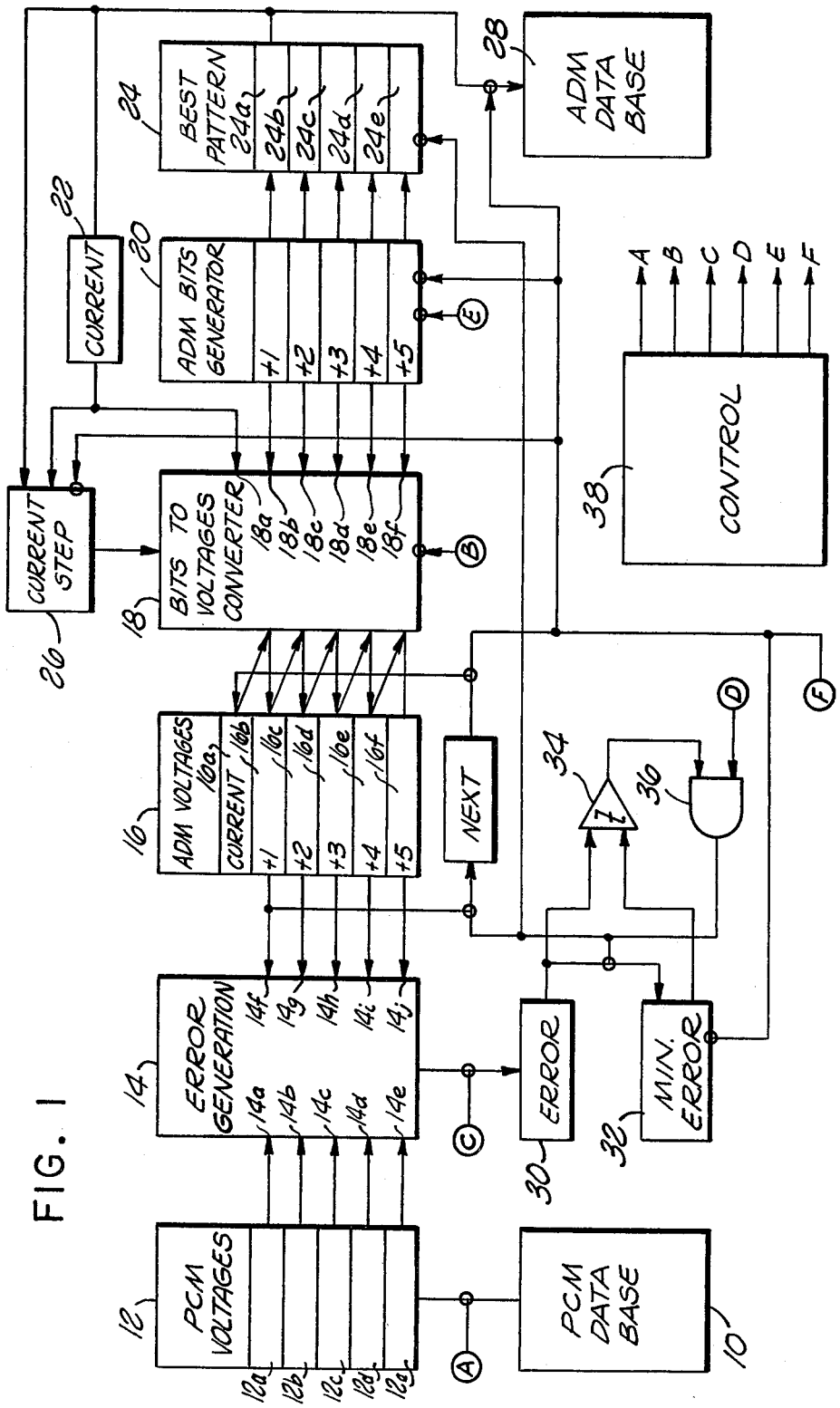
FIG. 1 is a schematic diagram of an adaptive delta modulation encoding system constructed according to the principles of the present invention.

FIG. 1 is a block diagram of an ADM data signal encoding system constructed according to the principles of the present invention. The embodiment shown in FIG. 1 operates on a pulse code modulation ("PCM") data base 10 to generate a stream of ADM data bits based on the PCM data read out serially from the data base 10. The ADM data bits can be demodulated by a standard one bit memory adaptive delta demodulator such as described in "Adaptive Delta Modulation with a One-Bit Memory", by N. S. Jayant, The Bell System Technical Journal, Vol. 49, No. 3, March, 1970.

The PCM data base 10 comprises a series of sequential digital words corresponding to the instantanious signal level of a waveform which is to be encoded into ADM data. The sample rate of the PCM data is equal to the bit rate of the ADM data to be generated.

The words of PCM data may be provided in any suitable digital format. Thus, for example, 32 bit floating point format provides a useful encoding format because of the wide range of values which may be expressed for the number of bits utilized, and because relatively inexpensive devices are available which operate on data so formatted and which can be used in the practice of the invention.

The PCM data is generated according to known techniques and is stored in a suitable storage medium, for example a computer memory. The stored PCM data forms the PCM data base 10.

The output of the PCM data base 10 is connected to the input of a "queue", or stack of registers 12 connected in last-in-first-out ("LIFO") configuration. Each of the registers 12a–12e in the stack 12 is connected to one of a first set of inputs 14a–14e of an error generation circuit 14. A second set of inputs 14f–14j of the error generation circuit 14 is connected to the outputs of five registers 16b–16f of a stack 16 of such registers connected in parallel configuration. The inputs of registers 16a–16f are connected to the outputs of a converter 18 which converts a series of sequential ADM bits into a corresponding series of PCM voltage values. Five inputs 18b–18f of the converter 18 are connected to the outputs of an ADM bits generator 20. The ADM bits generator 20 is a five bit counter which in a single count cycle counts from 00000 to 11111 in binary. The ADM bits generator 20 thus generates in one count cycle all possible combinations of bits in a five bit sequence. The sixth input 18a of the converter 18 is connected to the output of a current bit register 22.

The outputs of the ADM bit generator 20 are also connected to a Best Pattern stack of registers 24. The output of register 24a in stack 24 corresponding to the most current ADM bit in the pattern stored therein is connected to a Current Step generator 26, to the input of Current Bit register 22, and to the input of an ADM data base 28. The output of the Current Step generator 26 is connected to an input of the bits to voltages converter 18.

The output of the Error Generation circuit 14 is connected to the input of an Error value storage register 30. The output of the error register 30 is connected to the input of a Minimum Error value storage register 32 and to one input of a comparator 34. The other input of the comparator 34 is connected to the output of the Minimum Error register 32. The output of the comparator 34 is connected to one input of an AND gate 36.

A Control circuit 38 generates a series of control signals which are outputted on lines A–F. Line A controls the transfer of PCM data from the PCM data base 10 to the PCM voltage register stack 12. Line B controls the conversion of the bit pattern appearing at the inputs of the converter 18 to the PCM voltage values which are applied to the output of Converter 18. Line C controls the transfer of the computed error signal from the Error Generation circuit 14 to the Error register 30. Line D is connected to the input of AND gate 36. The signal on Line D controls the transfer of the error signal from register 30 to register 32, controls the transfer of the ADM voltage level signal in register 16b to the NEXT register 17, and causes the bit pattern in the ADM bit generator 20 to be transferred to the Best Pattern stack of registers 24. The signal on control Line E increments the ADM bit pattern generator. The signal on control Line F sets the minimum error register 32 to a maximum value transfers the signal in the NEXT register 17 to register 16a in the ADM voltage register stack 16, updates the current step generator 26, initializes the ADM bit generator to all zeros, and causes the most current bit of the pattern stored in the Best Pattern register stack 24 to be transferred to the ADM data base 28.

The circuit shown in FIG. 1 operates in the following manner. Initially, a pulse is applied on line A to transfer a word of PCM data to the stack of PCM voltage registers 12. The remainder of the system could be activated at this time, however, it is preferable to repeat the application of a pulse on line A four more times so as to completely load the stack 12 of PCM voltage registers. In this way valid ADM data is generated from the start, and the generation of several bits of spurious start-up data is avoided.

Next, a signal is applied on line B which causes the ADM bits to voltages converter 18 to convert the pattern of ADM bits from generator 20 which are applied to the input of converter 18 to be converted into a corresponding series of voltage value. The series of ADM voltage values thus generated corresponds to the waveform which would be generated by an adaptive delta demodulator in the process of demodulating the pattern of ADM bits appearing at the output of the ADM bits generator 20. The initial pattern in the ADM bits generator 20 is a series of zeros. Hence, the initial ADM voltage values generated by the converter 18 is a series of values corresponding to a negative going portion of waveform. As the voltage values are generated by converter 18 they are also simultaneously loaded into registers 16b–16f of the stack 16 of ADM voltage register. Register 16A, being the current AOM voltage value register, is maintained at its initial zero level.

At this point in the sequence the Error Generation circuit 14 has at inputs 14a–14e the series of PCM voltages accessed from the PCM data base 10, and has at inputs 14f–14j the sequence of corresponding generated AOM voltages based on the bit pattern in AOM bits generator 20. The Error Generation circuit 14 operates on corresponding inputs 14a and 14f, 14b and 14g, 14c and 14h, 14d and 14i, and 14e and 14j, and generates a numerical value signal corresponding to the mean square difference between the corresponding PCM voltages and ADM voltages.

Next, a signal is applied to Line C which causes the computed error signal from Error Generation circuit 14 to be loaded into the Error register 30. The output of the Error register 30 is also applied to the input of comparator 34. The other input of comparator 34 is connected to the output of Minimum Error register 32 which, it will be recalled, is initially set to its maximum value. When the output of Error register 30 is smaller than the output of Minimum Error register 32, the output of comparator 34 is at a high state. If not, the output of comparator 34 is low. In this way, the appearance of a lower error value in register 30 than previously computed error values causes a high output in comparator 34.

Subsequently, a pulse is applied on Line D. If the output of comparator 34 is low, the pulse on line D does not change the output of AND gate 36 which remains low. However, if the output of comparator 34 is high, the application of the pulse on line D causes a pulse to appear as well at the output of AND gate 36. The pulse at the output of AND gate 36 causes the signal stored in Error register 30 to be transferred to Minimum Error register 32, causes the ADM voltage value in register 16b to be transferred to the NEXT register 17, and causes the ADM bits pattern in generator 20 to be transferred to the Best Pattern stack of registers 24.

A signal on Line E then increments the ADM bits generator 20 causing a new pattern (00001) to appear at the output thereof which is the next bit pattern in the count sequence.

The steps controlled by signal lines B,C,D and E are repeated 32 times ($2^5$) thus causing a complete cycling of ADM bits generator 20 and the error generation and error comparison functions for each generator 20 bit pattern.

A signal then appears on Line F which resets the Minimum Error register 32 to its maximum value, transfers the values stored in the NEXT register 17 to register 16a, increments the Current Step generator 26 and resets the ADM bits generator 20 to all zeros. The signal on Line F also causes the current Best Pattern ADM bit stored in register 24a to be transferred to the ADM data base 28, to the Current Bit register 22 and to the Current Step generator 26.

In an operational sequence, the five PCM voltages stored in registers 12a–12e provide a sequence of waveform level reference points at intervals corresponding to the sampling rate of the sequence of ADM bits generated by the system. After the PCM voltage values are loaded into stack 12 of registers by the application of the signal on Line A the signal on Line B causes the ADM bits pattern appearing at the output of the ADM bits generator 20 to be converted into a sequence of voltage values corresponding to the waveform which would be generated by the demodulation of the generated pattern of ADM bits by an ADM modulator. This series of voltage values is stored in the ADM voltages registers 16b–16f.

The voltage values stored in register 16b–16f are applied to inputs 14f–14j of the error generation circuit. Thus, following the application of signals on Lines A and B the error generation circuit 14 has applied to the inputs thereof the sequence of reference PCM voltages (inputs 14a–14e) and a corresponding sequence of generated voltage values (14f–14j) for comparison in the error generation circuit 14 and consequent generation of a signal representative of the mean square error between the sequence of voltage values being compared. Upon the application of a signal on Line C, the computed error signal is transferred to the error register 30 for storage.

It will be recalled that the initial setting in the minimum error register 32 is the maximum value possible. Thus, after the first computed error signal, which in nearly every case will be something less than the maximum possible value, is stored in Error register 30, the comparison made at the inputs of comparator 34 results in the output of comparator 34 going high, indicating that the value in Error register 30 is less than the value in Minimum Error register 32. In general, a high level at the output of comparator 34 corresponds to a determination by the circuit that the mean square error difference of the current ADM bits pattern appearing at the outputs of generator 20 is less than any previously determined mean square error for previous patterns of ADM bits.

Because of the high level at the output of comparator 34, the application of a signal on Line D results in the appearance of a corresponding signal at the output of AND gate 36. This causes the error value stored in Error register 30 to be transferred to the Minimum Error register 32, the ADM voltage value stored in register 16b to be transferred to the NEXT register 17, and causes the ADM bits pattern in generator 20, determined to have the minimum mean square error, to be transferred to the Best Pattern stack of registers 24, thus preserving the pattern in the event that, upon the completion of the cycle, that pattern is the pattern which has the least mean square error among all possible patterns of five bits.

The signals on Lines B, C, D and E cycle in the manner described above repetitively until all possible combinations of bits in ADM bits generator 20 have been generated and subject to the Error Generation tests implemented by the circuitry in the manner described above. At the completion of this cycle, the pattern of ADM bits producing, when subject to ADM demodulation, a waveform having minimum possible error as compared with the waveform represented by the sequence of reference PCM voltages, is stored in the Best Pattern register stack 24.

Following the last cycle of lines B–E, a signal is applied to Line F, causing the first bit in the Best Pattern register stack 24 to be transferred to the ADM data base 28. The signal on Line F also causes the Minimum Error register 32 to be reset with the maximum value transfers the corresponding ADM voltage value stored in the NEXT register 17 to the current ADM voltage value register 16a, increments the Current Step generator 26 in a manner described in detail below, and resets the ADM bits generator 20 to all zeros, all in preparation for a subsequent cycling for comparison with the next sequence of PCM voltages.

Then, following the application of a signal on Line F, a signal is applied again to Line A, thereby loading the next PCM data value into register 12e, and shifting the contents of registers 12b–12e up to registers 12a to 12d. The previous contents of register 12a are simply destroyed. The aforementioned cycling of Lines B–E is then implemented to derive the Best Pattern of ADM bits for the sequence of reference voltage values in stack 12 of registers, and the most current bit from the Best Pattern is stored in the next bit location in the ADM data base 28.

The entire sequence continues as described above until all of the PCM data words have been cycled through the stack 12 of PCM voltages and the ADM data base 28 is completely constructed. The resulting ADM data base 28 is optimized so as to produce, upon ADM demodulation a waveform having the least error as compared with the waveform represented by the PCM data base 10 as computed by the error generation function implemented in the error generation circuit 14.

Figure 2:
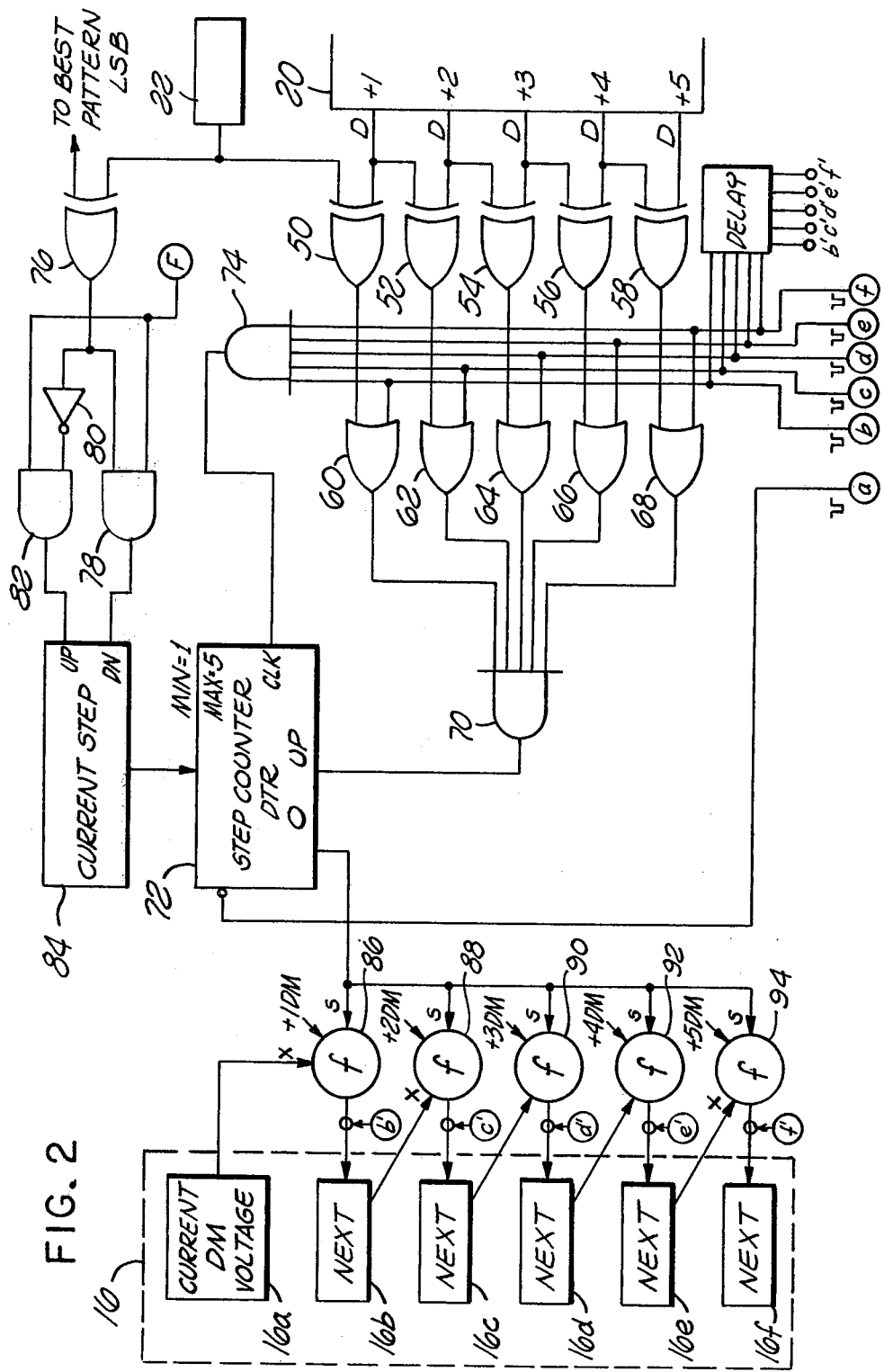
FIG. 2 is a schematic diagram of the ADM to PCM converter of FIG. 1.

FIG. 2 is the schematic diagram of the bits to voltages converter 18 of FIG. 1. As shown, Line B described in connection with FIG. 1 is actually comprised of six lines: a, b, c, d, e, and f. The signal on Line B actually comprises a sequential series of negative-going pulses on lines a–f, beginning with the initial pulse on line a. Line a is connected to the LOAD input of Step Counter 72. Lines b–f are connected to the input of five OR gates 60–68, to the input of an AND gate 74 and to the inputs of five delay lines 75a–75e. The outputs of delay lines 75a–75e comprise lines b'–f', respectively. The outputs of ADM bits generator 20 are connected as shown to the inputs of five exclusive OR gates 50–58.

The output of current ADM bits register 22 is connected to one input of exclusive OR gate 50 and to one input of a further exclusive OR gate 76, as shown. The other input of exclusive OR gate 76 is connected to the least significant bit register 24a of the stack of Best Pattern registers 24 (FIG. 1). The output of exclusive OR gate 76 is connected to one input of a further AND gate 78, and to the input of an inverting amplifier 80, the output of which is connected to one input of another AND gate 82. The other inputs of AND gates 78 and 82 are connected to Line F.

The output of AND gate 78 is connected to the DOWN INPUT of a current step counter 84, while the output of AND gate 82 is connected to the UP INPUT of counter 84. The output of current step counter 84 is connected to the input of step counter 86.

The bit values appearing at the output of ADM bits generator 20 are applied to OR gates 50–58, along with the contents of current ADM bit register 22, and are clocked sequentially by the signals on Lines b–f so as to sequentially pass through OR gates 60–68 signals representative of the difference between adjacent bits in the current ADM bits pattern. These pulses are applied to the input of AND gate 70 and are thereby passed through to the DIRECTION input of step counter 86. The sequence of pulses appearing on Lines b–f are also applied to the input of AND gate 74 which passes each of them through to be applied to the CLOCK input of counter 72.

The output of counter 72 is applied to the "s" input of a series of function implementing circuits 86–94. The function implementing circuits 86–94 also receive as inputs the outputs of the ADM generator 20, respectively, as well as the contents of registers 16a–16e, respectively. These inputs are operated on in a manner which is described below, to generate the corresponding ADM voltages for the pattern of bits appearing at the output of the ADM bits generator 20. The outputs of the function implementing circuits 86–94 are transferred sequentially to registers 16b–16f, respectively, in response to pulses appearing on Lines b'–f'.

A conversion sequence by the circuit in FIG. 2 proceeds as follows. It will be noted initially that the outputs of the ADM bits generator 20 are connected to exclusive OR gates 50–58 which are in turn connected to OR gates 60–68 along with Lines b–f such that a negative-going pulse appearing on Line b, c, d, e or f will cause a negative-going pulse at the output of OR gate 60, 62, 64, 66 or 68, respectively, only if both of the two ADM bits generator 20 outputs connected to the inputs of the respective exclusive OR gates are both zeros or both ones. Otherwise, the OR gate output remains high. Consequently, a negative-going pulse appears at the output of AND gate 70 only when a negative-going pulse appears on one of line d–f and the two inputs to the associated exclusive OR for that line, for example, exclusive OR gate 50 associated with Line c, are both either high or low. Each of the pulses appearing on Lines d–f is transferred through AND gate 74 and appears at the CLOCK input to step counter 72.

The step counter 72 counts in steps up or down between the range of zero and four in response to the appearance of a pulse signal at the clock input thereof. The counter counts up if the signal level at the DIRECTION input is zero. If the direction input is one, the counter counts down from the previous step. The step counter 72 starts counting from an initial count provided to it from the output of current step counter 84. The current step counter performs a similar function as that of step counter 72, only current step counter 84 is clocked by the pulse on line F, to keep track of the current Best Pattern least significant bit so as to provide the proper initial count value from which step counter 72 counts at the beginning of a cycle of clock pulses on lines b–f.

In this way, step counter 72 provides as an output a series of step values corresponding to the step values which would be produced in real time by an ADM demodulator demodulating the series of ADM bits appearing at the output of ADM Bits generator 20. This step output is applied to the function implementing circuits 86–94 and operated on in a manner which will now be described in connection with FIG. 3.

Figure 3:
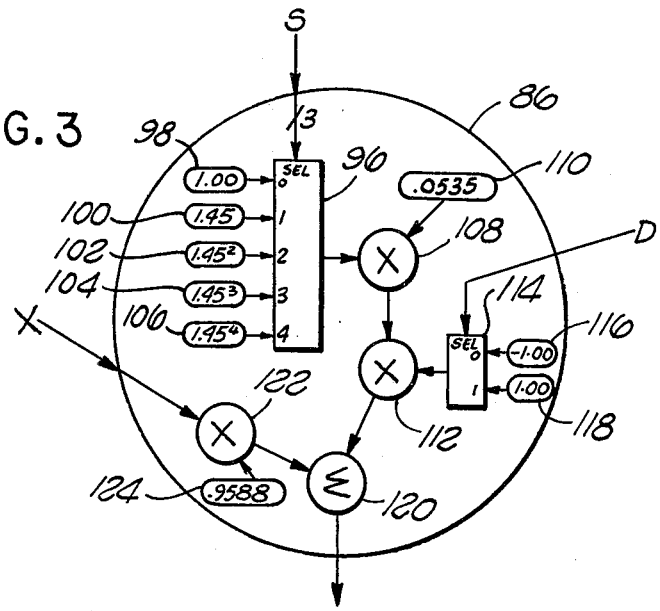
FIG. 3 is a schematic diagram of a portion of the schematic diagram of FIG. 2.

FIG. 3 is a schematic diagram of one of the function implementing circuits 86 shown in FIG. 2. Each of the function implementing circuits 86–94 is the same, and therefore the description in connection with circuit 86 applies as well to each of the other circuits 88–94.

Function implementing circuit 86 operates on the X, D and S inputs in a manner so as to implement the following transfer function:

$$F(X,S,D) = 0.9588X + (-1)^{D+1}(0.0535)(1.45)^{(S-1)}.$$

This function represents an approximation of the transfer function for a standard one bit memory adaptive delta demodulator. Thus, the "next step" input, S, is applied to the SELECT input of a multiplexer 96 which selects one of five inputs each connected to one of five corresponding switches 98–106, each set to a different digital value, 1.00, 1.45, $1.45^2$, $1.45^3$, $1.45^4$, respectively. The output of multiplexer 96 thus represents the quantity $1.45^S$.

The output of the multiplexer 96 is applied to one input of a digital multiplier 108, the other input of which is connected to digital switch 110 set to the number 0.0535. The output of multiplier 108 is applied to one input of another multiplier 112, the other input of which is connected to the output of yet another multiplexer 114. The next ADM digit input, "D", is connected to the SELECT input of multiplexer 114. Multiplexer 114 selects between two inputs set to digital words corresponding to −1.00 and 1.00, respectively. The output of digital multiplier 112, representing the expression $(-1)^{D+1}(0.0535)(1.45)^{(S-1)}$, is applied to one input of a digital summer 120. The previous current ADM voltage value, "X", is applied to one input of a further digital multiplier 122, the other input of which is connected to a digital switch set to the value 0.9588. The output of multiplier 122, representing the quantity 0.9588X, is applied to the other input of summer 120. The output of summer 120, representing the complete expression F(X,S,D), forms the output of the function implementing circuit 86.

Figure 4:
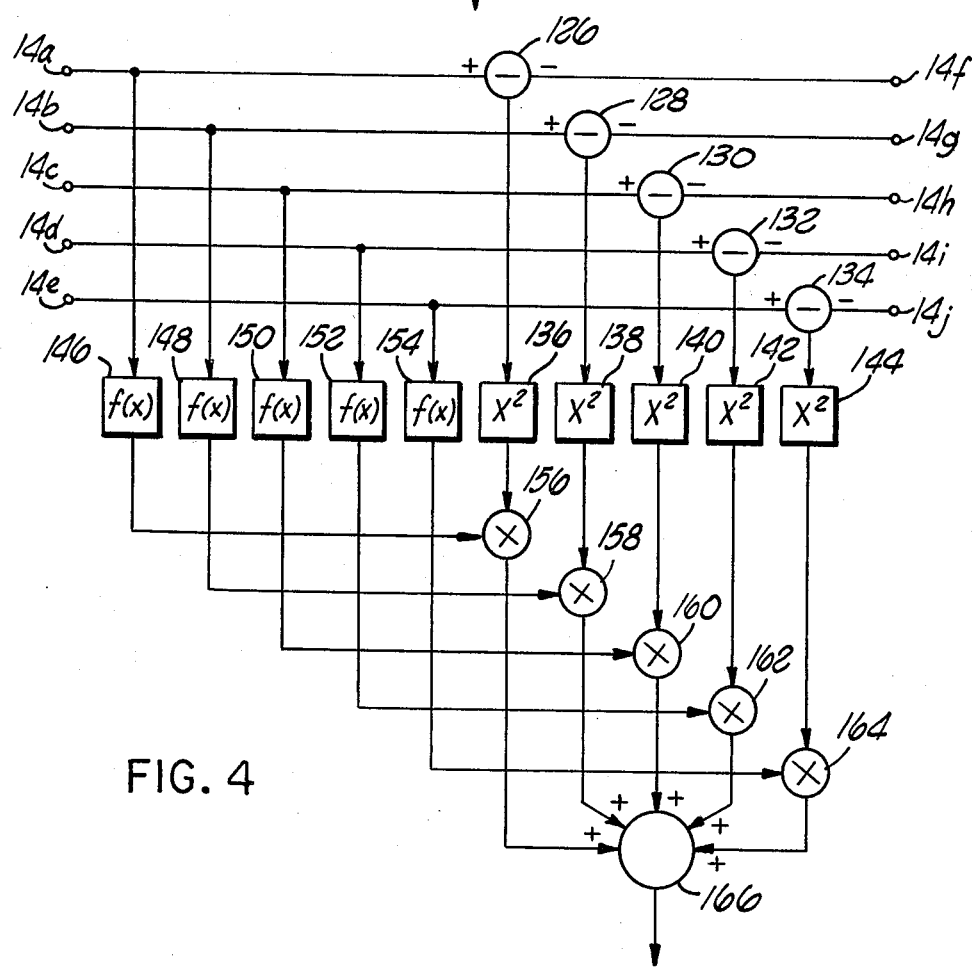
FIG. 4 is a schematic diagram of the error generation circuit of FIG. 1.

A schematic diagram of the error generation circuit 14 of FIG. 1 is shown in FIG. 4. The error function circuit operates on the set of inputs 14a–14e and on the set of inputs 14f–14j to produce an output signal representative of the mean square difference between corresponding inputs in each set of inputs. The circuit has provision for weighting the error contributions from each pair of inputs according to a desired weighting function. For example, if desired, error values generated for reference voltage values of lower magnitude may be given greater weight in the composite error signal value generated by the circuit.

The circuit operates in the following manner. The reference voltage on input line 14a is applied to the plus input of a subtractor 126, while the generated voltage value on line 14f is applied to the minus input of subtractor 126. Likewise, input lines 14b–14e are applied to the plus inputs of subtractors 128–134, respectively, while inputs 14g–14j are applied to the negative inputs thereof, respectively. The outputs of subtractors 126–134 are applied to the inputs of squaring devices 136–144, respectively.

Input lines 14a–14e are also connected to the inputs of function implementing circuits 146–154, respectively, which control the weighting factor. The function implementing circuits 146–154 operate on the associated input signals and implement a selected mathematical function thereon in a manner similar to that described above in connection with FIG. 3. Thus, for example, the function may be 1/(input). In that event, mean square differences between generated voltage levels and relatively lower magnitude reference voltage levels are given greater weight in computing the total error value for a particular sequence of samples. Such a weighting function would be considered desirable if it were determined for a particular application that deviations in the waveform at lower levels have greater impact on the characteristic desired to be recovered from the reconstructed ADM demodulated waveform, for example the intelligibility of an ADM encoded voice waveform. The present preferred application of the present invention is to encode audio data for recording on an optical disc. In this connection, the preferred weighting function, f(x), is $e^{-2.708+2.708(|x|)}$ which provides a logarithmic weighting emphasizing lower signal levels. The implementation of this function is well within the scope of one having ordinary skill in this art.

The output of function implementing circuit 146 is applied to one input of a multiplier 156, the other input of which is connected to the output of squarer 136. Similar connections are made between function implementing circuits 148–154 and squarers 138–144, and multipliers 158–164. The outputs of multipliers 156–164 are applied to the inputs of a summer 166, the output of which comprises the output of error generation circuit 14.

Figure 5:
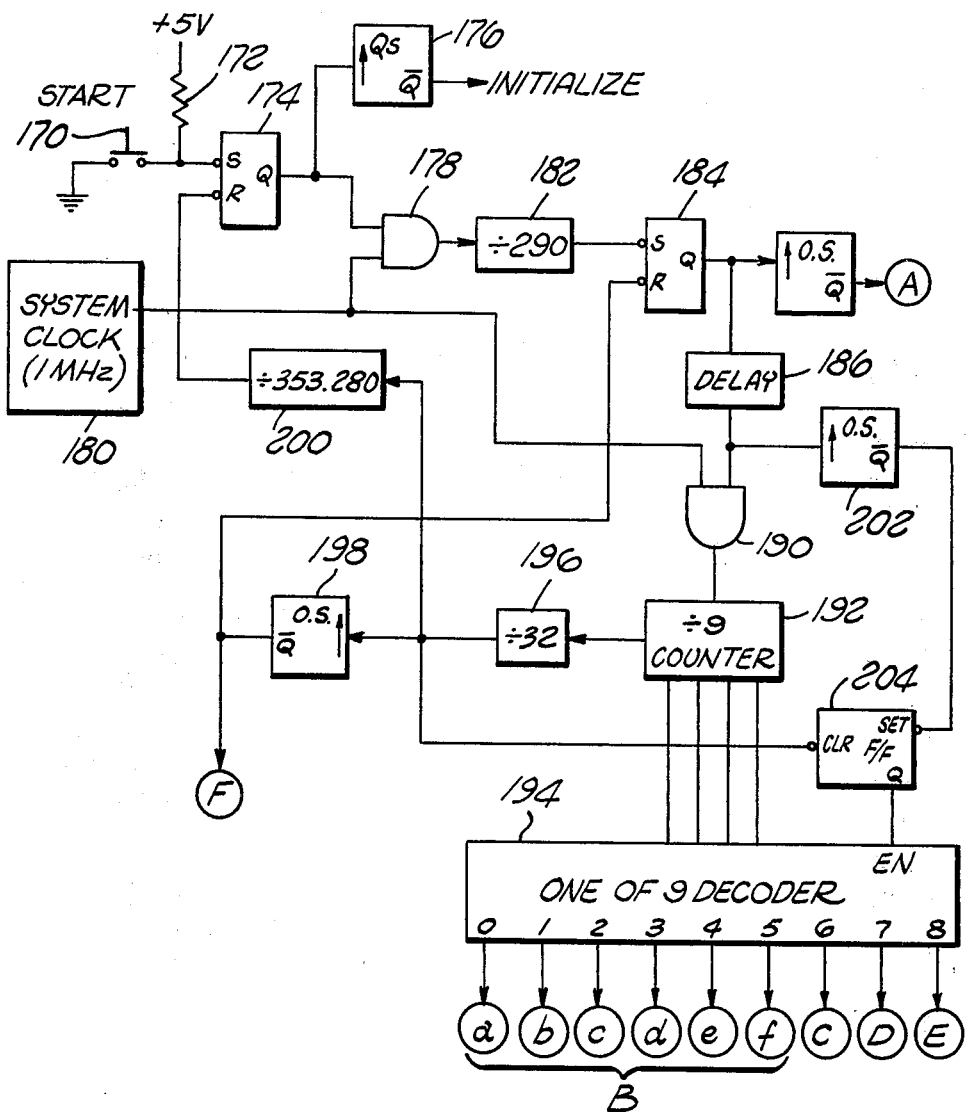
FIG. 5 is a schematic diagram of a system control circuit suitable for generating the control pulses utilized by the circuit shown in FIG. 1.

A circuit diagram of the system Control circuit 38 (FIG. 1) is shown in FIG. 5. The Control circuit 38 implements a control pulse generation scheme based on the encoding of a 353,280 word PCM data base into an ADM data base of 353,280 bits.

A "Start" function is provided for the control circuit 38 by a pushbutton switch 170 which connects a five volt source and the SET input of a flip flop 174 to ground through a resistor 172, as shown. Pushing the start button 170 provides a negative going pulse to the SET input of flip flop 174 causing the Q output thereof to go high. The Q output of flip flop 174 is connected to the rising edge input of a one shot 176 wich provides a one microsecond pulse at its $\overline{Q}$ output which can be used for initializing the circuit shown in FIG. 1, for example, for clearing address-generating counters associated with the data base transfers, and the like.

The Q output of flip flop 174 is also applied to one input of an AND gate 178 the other input of which is connected to the output of a one megahertz system clock 180. The output of AND gate 178 is applied to the input of a divide-by-290 device 182, the output of which is connected to the inverting SET input of a further flip flop 184. The Q output of flip flop 184 is connected to the input of a 500 nanosecond delay 186 and to the rising edge input of a 100 nanosecond one shot 188. The triggering of the rising edge input of one shot 188 causes a 100 nanosecond pulse to be applied to Line A.

The output of 500 nanosecond delay 186 is applied to one input of a further AND gate 190 the other input of which is connected to the output of the system clock 180. The output of AND gate 190 is connected to a divide-by-nine counter 192. The counter outputs of divide-by-nine counter 192 are connected to the input of a "One of Nine Decoder". The zero through five outputs of decoder 194 comprise Lines a–f (Line B), while outputs 6, 7 and 8 comprise Lines C, D, and E, respectively.

The output of 500 nanosecond delay 186 is also connected to the rising edge input of a further 100 nanosecond one shot 202. The $\overline{Q}$ output of one shot 202 is connected to the inverting SET input of another flip flop 204. The Q output of flip flop 204 is connected to the ENABLE input of decoder 194.

The carry output of counter 192 is applied to the input of a divide-by-32 device 196, the output of which is connected to the rising edge input of a still further 100 nanosecond one shot 198, to the input of a divide by 353,280 device 200 and to the inverting CLEAR input of flip flop 204. The output of divide by 353,280 is connected to the inverting RESET input of one shot 174. The $\overline{Q}$ output of one shot 198 is connected to the inverting RESET input of flip-flop 184 and also is connected to Line F.

The system control circuit operates as follows. The start switch 170 is pressed causing flip-flop 174 to be set, which in turn triggers one shot 176. One shot 176 provides an Initialize pulse at the $\overline{Q}$ output thereof.

The positive pulse Q output of flip-flop 174 also causes the application of the system clock pulses to the input of divide-by-290 device 182. Two hundred and ninety system clock pulses after the setting of flip-flop 174 a falling edge signal is applied to the inverting SET input of flip-flop 184 causing a pulse to be applied to the input of one shot 188, thereby generating a negative going pulse output which is applied to Line A.

The signal at the Q output of flip-flop 184 is also applied to the 500 nanosecond delay 186 which delays the pulse by 500 nanoseconds and then applies it to AND gate 190 and the inverting input of one shot 202. One shot 202 outputs a 100 nanosecond pulse which sets flip-flop 204 and enables multiplexer 194. The AND gate 190 passes the system clock through to the divide by nine counter 192 which immediately causes the decoder 194 to begin cycling output pulses on Lines a-e as it counts cyclically from zero to eight. The carry output of counter 192 is applied to divide by 32 device 196.

After 32 ($2^5$) cycles of counter 192, divide-by-32 device 196 produces an output which clears flip-flop 204 thereby disabling decoder 194 and triggering one shot 198 which thus produces a negative pulse output which is applied to Line F. This pulse output of one shot 198 is also applied to the reset input of flip-flop 194 to prepare for the next output of divide-by-290 device 182 to begin the next complete cycle of the control circuit. The output of the divide-by-32 device 196 is also applied to the input of divide by 353,280 device 200 which resets flip-flop 174 after the entire 353,280 byte message has been encoded.

The embodiment described above operates relatively rapidly, providing optimized ADM bits at a rate of approximately 3 kilohertz. However, the invention may be implemented in a less costly manner by programming a microprocessor to implement the logic of the above described circuit. The rate at which a microprocessor so programmed can generate such optimized ADM bits may be significantly less than the rate at which the above described circuit can generate such bits, but where the ADM data base ultimately generated is to be stored for later use, the additional time in the generation of the data base may be considered acceptable when other factors are considered. Because of cost considerations and flexibility of modification of the device it is presently considered preferred to implement the invention by incorporating the logic of the above described circuit in the programming of a microprocessor. Such programming is considered well within the scope of one having ordinary skill in this art, once the principles of the invention, as described herein, are understood.

It will be appreciated from the foregoing that the present invention represents a significant advance in the field of delta modulation encoding techniques, especially as applied to adaptive delta modulation encoding of a segment of audio frequency information to be stored on a recording medium for subsequent recovery, decoding and playback. While several embodiments have been described, it should be understood that other modifications may be made without departing from the spirit and scope of the invention. Accordingly, the invention is not to be limited accept as by the appended claims.

I claim:

1. A method for generating a series of delta modulation data signals at a predetermined clock rate, corresponding to a predetermined analog waveform, comprising the steps of:
   (a) providing a series of generated digital signals corresponding to amplitude values of said waveform, and having a sample rate equal to said predetermined clock rate;
   (b) storing sequential groups of sequential digital signals taken from said series;
   (c) providing a series of predetermined patterns of delta modulation data signals for each said group of sequential digital signals;
   (d) converting said patterns of delta modulation signals into corresponding sequences of derived digital signals corresponding to the amplitude values, taken at said sample rate, of a delta modulation waveform derivable from said sequence by way of delta demodulation;
   (e) comparing, for each said group of generated digital signals, each of said sequences of derived digital signals with its associated group, and selecting for each said group said sequence of derived digital signals which has the least quantifiable difference, according to a predetermined relationship, with said associated group of generated digital signals;
   (f) storing in a sequential order at least one delta modulation signal from each said pattern of delta modulation signals associated with said selected sequences.

2. A method according to claim 1 wherein said steps of storing, providing a series of predetermined patterns, converting, comparing, selecting and storing are performed in sequential, iterative fashion.

3. A method for generating a series of delta modulation data signals at a predetermined clock rate, corresponding to a predetermined analog waveform, comprising the steps of:
   (a) providing a series of generated digital signals corresponding to amplitude values of said waveform, and having a sample rate equal to said predetermined clock rate;
   (b) storing a first predetermined group of sequential digital signals taken from said series;
   (c) providing a first predetermined sequence of delta modulation data signals for a number of bits corresponding to said predetermined group;
   (d) converting said sequence of delta modulation data signals into a corresponding sequence of derived digital signals corresponding to the amplitude values, taken at said sample rate, of a delta modulation waveform derivable from said sequence by way of delta demodulation;
   (e) comparing said derived digital signals with said generated digital signals and generating a first error signal representative of a quantifiable difference between said signals;
   (f) providing a predetermined number of subsequent predetermined sequences, different from preceding sequences, of adaptive delta modulation data signals for said number of bits;
   (g) performing said steps of converting and comparing on said subsequent predetermined sequences to obtain subsequent error signals associated with said subsequent predetermined sequences;
   (h) selecting the predetermined sequence of adaptive delta modulation data signals having the lowest associated error signal;
   (i) storing at least one delta modulation signal from said selected sequence of delta modulation signals data;
   (j) storing sequentially a plurality of subsequent groups of sequential digital signals taken from said series; and
   (k) performing steps (c) through (i) on each said subsequent group in iterative sequence to obtain a complete series of delta modulation data signals corresponding to said predetermined analog waveform.

4. Apparatus for generating a series of delta modulation data signals at a predetermined clock rate, corresponding to a predetermined analog waveform, comprising;

(a) means for providing a series of generated digital data signals having values corresponding to amplitude values of said waveform in sample units having a sample rate equal to said predetermined clock rate;

(b) means for storing said sequential groups of sequential digital signals taken from said series;

(c) means for providing a series of predetermined patterns of delta modulation data signals for each said group of sequential digital signals;

(d) means for converting said patterns of delta modulation signals into corresponding sequences of derived digital signals corresponding to the amplitude values, taken at said sample rate, of a waveform derivable from said sequence by way of delta demodulation;

(e) means for comparing, for each said group of generated digital signals, each of said sequences of derived digital signals with its associated group and for selecting for each said group said sequence of derived digital signals which has the least quantifiable difference, according to a predetermined relationship, with said associated group of generated digital signals; and (f) means for storing in a sequential order at least one delta modulation signal from each said pattern of delta modulation signals associated with said selected sequences.

5. Apparatus according to claim 4, wherein said means for storing sequential groups of sequential digital signals comprises a stack of registers.

6. Apparatus according to claim 4, wherein said means for providing a series of predetermined patterns comprises;
(a) digital counter; and
(b) means for incrementing said counter.

7. Apparatus according to claim 4, wherein said means for converting said patterns comprises means for generating signals based on said pattern of delta modulation signals in accordance with a function representative of conversion from delta modulation to the digital format of said generated digital signals.

8. Apparatus according to claim 4, wherein said means for comparing comprises error means for comparing said generated digital signals with said derived digital signals, sample unit by sample unit, and for generating an error signal corresponding to the sum of the difference values between said signals determined by said comparison, weighted by a predetermined weighting function.

9. Apparatus according to claim 8, wherein said difference value comprises the square of the amount of said difference.

10. Apparatus according to claim 9, wherein said weighting function comprises the inverse of said difference value.

11. Apparatus according to claim 4, further comprising means for controlling sequentially said means for storing sequential groups, said means for providing a series of predetermined patterns, said means for converting, said means for comparing and said means for storing in a sequential order, such that the functions of said elements are performed in iterative fashion.

* * * * *